United States Patent
Kwon et al.

[11] Patent Number: 5,959,915
[45] Date of Patent: Sep. 28, 1999

[54] TEST METHOD OF INTEGRATED CIRCUIT DEVICES BY USING A DUAL EDGE CLOCK TECHNIQUE

[75] Inventors: Hyuk Kwon, Cheon; Dong-wook Kim; Keun-won Cho, both of Cheonan; Hyun-seop Shim, Incheon, all of Rep. of Korea

[73] Assignee: Samsung Electronics, Co., Ltd., Suwon, Rep. of Korea

[21] Appl. No.: 09/107,093

[22] Filed: Jun. 29, 1998

[30] Foreign Application Priority Data

Jun. 30, 1997 [KR] Rep. of Korea .................. 97-29707

[51] Int. Cl.[6] .................................................. G11C 7/00
[52] U.S. Cl. .................................................. 365/201
[58] Field of Search .................. 365/201, 233, 365/233.5; 371/21.1, 22.1

[56] References Cited

U.S. PATENT DOCUMENTS

| | | | |
|---|---|---|---|
| 4,672,583 | 6/1987 | Nakaizumi | 365/201 |
| 5,659,508 | 8/1997 | Lamphier et al. | 365/201 |
| 5,875,153 | 2/1999 | Hii et al. | 365/233 |
| 5,883,521 | 3/1999 | Nishikawa | 324/765 |
| 8,222,228 | 10/1998 | Irrinki et al. | 364/580 |

*Primary Examiner*—David Nelms
*Assistant Examiner*—Anh Phung
*Attorney, Agent, or Firm*—Marger Johnson & McCollom, P.C.

[57] ABSTRACT

A test method can test high speed synchronous memory devices by using a tester having a minimum rate and a minimum clock cycle slower than operating speed of the devices to be tested. The test method transforms a pulse signal generated by the tester to be transformed into a clock signal having a frequency higher than the minimum rate, a test cycle of the test equipment then being determined based on a cycle time of the pulse signal, the operating cycle of the IC devices being determined based on a cycle time of the clock signal, and an input setup time and an input hold time of control signals which are supplied from the tester to the devices are separately measured for every two or more operating cycles of the IC devices.

20 Claims, 3 Drawing Sheets

TEST METHOD OF INTEGRATED CIRCUIT DEVICES BY USING A DUAL EDGE CLOCK TECHNIQUE

BACKGROUND OF THE INVENTION

1. Field of the Invention

The present invention generally relates to test of semiconductor integrated circuit devices, and more particularly to a test method for testing synchronous DRAMs which operate at higher speed than the maximum frequency of a test equipment.

2. Description of the Related Arts

The present memory devices are faster than conventional standard DRAMs (Dynamic Random Access Memory) and SRAMs (Static DRAM). These high speed synchronous devices are furthermore expected to have even higher clock speeds in the future. The current synchronous DRAMs have internal circuits operating in synchronous with an external system clock and represent very high operating speed, for example 7 nano seconds (=143 MHZ) in case of 64M synchronous DRAM. Accordingly, test equipment for testing the high speed devices is required to be equally fast as well.

However, faster test equipment is very expensive and therefore leads to a high investment cost. Further, in some cases the progress of the test equipment does not follow the development of the synchronous devices and therefore is simply not available for purchase. Accordingly, it would be beneficial if the high speed synchronous devices could be tested by using the existing low speed test equipment. Thus, the investment cost could be reduced and newly developed devices could be brought to market more quickly.

The inadequacies of the lower speed test equipment in testing high speed synchronous DRAMs are described as follows:

First, the test equipment has a minimum rate which corresponds to the limit frequency of a clock signal which the test equipment can generate. The clock signal frequency of the test equipment has a close relation to the clock cycle time, $t_{cc}$, of the synchronous DRAM. For instance, if a synchronous DRAM operates at a speed of 143 MHZ, this synchronous device requires a system clock of equal or faster than 143 MHZ. However, a test equipment apparatus having 62.5 MHZ of the minimum rate cannot supply a proper system clock to the synchronous device.

Second, the minimum clock cycle of the test equipment must be short as the tested device. The minimum clock cycle means how long is maintained data '1' or '0' level of the control signals such as RAS/(Row Address Strobe), CAS/ (Column Address Strobe), WE/ (Writer Enable), and CS/ (Chip Select) which are provided for controlling the functions of the synchronous DRAM. For example, if a control signal is changed from data '0' to data '1' before the minimum clock cycle time, e.g., 5 ns passes, we cannot assure that the synchronous device recognizes the data '0' level of the control signal.

SUMMARY OF THE INVENTION

It is an object of the present invention to provide a test method and apparatus for testing high speed IC devices by using existing test equipment which has lower speeds than the devices to be tested.

The test equipment used in the present invention has a predetermined rate, such being a minimum rate and minimum clock cycle. The IC devices to be tested have operational speed faster than the minimum rate. According to test method and apparatus of the present invention, a pulse signal which is supplied from the test equipment for initiating the functions of the IC devices is transformed into a pulse signal having higher frequency than its minimum rate by using a dual edge clock generation technique. The test cycle of the test equipment is determined by the cycle of its pulse signal, and the operating cycle is determined by the cycle of its clock signal. An input setup time and an input hold time for a number of control signals for controlling the IC devices are separately measured every two or more operating cycles.

Though the sum of the input setup time and the input hold time of the control signals is shorter than the minimum clock cycle time of the test equipment, with the present invention, it is possible to test the characteristics of the IC devices by measuring either the input setup time or the input hold time in one operating cycle.

BRIEF DESCRIPTION OF THE DRAWINGS

The above objects and advantages of the present invention are described further below, with reference to the accompanying drawings in which.

DETAILED DESCRIPTION OF THE PREFERRED EMBODIMENT

Above, two inadequacies of lower speed test equipment were discussed. First referring to the minimum rate of the test equipment, a dual edge clock output is generated from the test equipment incorporating this invention. Next referring to the minimum clock cycle, an input set time and an input hold time of the control signals are supplied from the test equipment to the tested IC devices.

More particularly, in order to overcome the first inadequacy related to the minimum rate of the test equipment, we convert the frequency of a pulse signal generated from the test equipment to a clock signal having a higher frequency than the minimum rate. As an example, a dual clock signal generator 10 having input and output signals with different frequencies can be used as shown in FIG. 1.

Figure 1:
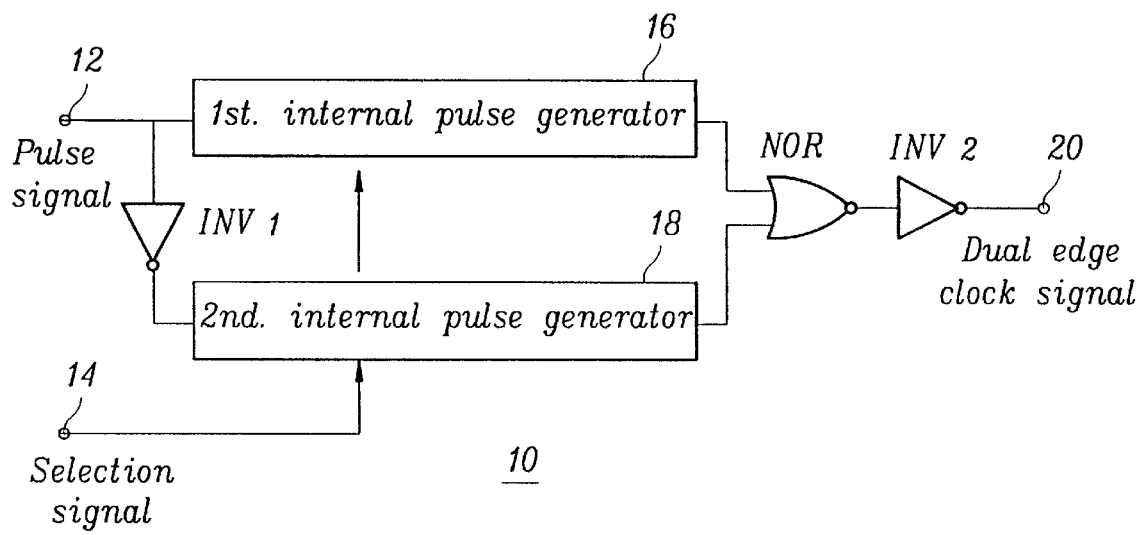
FIG. 1 is a schematic circuit diagram of an exemplary dual clock signal generator suitable for use in the present invention.

FIG. 1, a schematic diagram of a test apparatus 10 of this invention is shown. An integrated circuit, such as a DRAM 30 receives output from apparatus 10 for testing its circuits. For testing, a pulse signal toggling in a constant cycle time is supplied to an input terminal 12. On the one hand, this pulse signal may be used without being changed as a system clock of a synchronous device, if the minimum rate of a test equipment accommodates the operating speed of the synchronous device. On the other hand, if the synchronous device is not accommodated by the testing apparatus, the clock signal will be converted to higher than the minimum rate. Thus, to the other input terminal 14, a selection signal is delivered. The selection signal controls the operations of a first and a second pulse generators 16 and 18 and determines whether the pulse signal is to be transformed into a dual edge clock signal through an output terminal 20 or the pulse signal is delivered to the output terminal 20 without being changed.

To generate a dual edge clock signal the first and the second pulse generators 16 and 18 can generate respective pulse signals P1 and P2 by receiving a high going edge and a low going edge of the pulse signal received from input 12, respectively. The first and the second pulse generators can have the same structure, and in this case the second pulse generator 18 receives the converted pulse signal through an invertor INV1. Accordingly, the first pulse generator produces the first internal pulse signal P1 by receiving the high going edge of the pulse signal, while the second internal pulse signal P2 is generated with the low going edge of the pulse signal by the second pulse generator 18.

When the internal pulse signals P1 and P2 are ORed through the serially connected NOR gate and INV2 gate, a dual clock signal which has a two times higher frequency than the pulse signal on the input terminal 12 can be provided through the output terminal 20. Since the clock signal is generated by receiving both transition edges of the pulse signal, it is called a dual edge clock signal.

The dual clock generating circuit 10 can be formed as an internal circuit of the synchronous DRAM, and the pulse signal from input 12 is used as a system clock and the dual edge clock signal outputted to output 20 is used as an internal system clock. On the other hand, the dual clock generating circuit 10 can be formed outside of the synchronous DRAM, e.g., on a test board so that the dual edge clock signal directly provided as the system clock to the synchronous DRAM. In the latter case, the internal system clock has the same clock frequency of the system clock as in the conventional synchronous memory devices.

Figure 2:
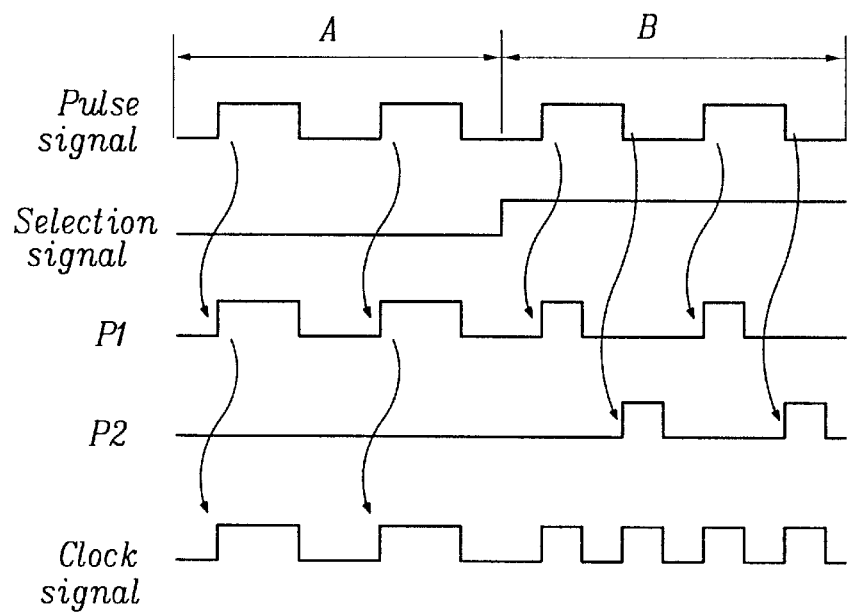
FIG. 2 is timing diagram of input and output signals and internal signals of the clock signal generator as shown in FIG. 1.

FIG. 2 is timing diagram of input and output signals and internal signals of the dual edge clock generating circuit 10 as shown in FIG. 1. Since the selection signal is '0' in section A, the first and the second pulse generator 16 and 18 are disabled so the input pulse signal delivered to the first internal pulse P1 is unchanged. When the selection signal changed to '1' in section B, the pulse generators 16 and 18 are all enabled and produce two pulse signals P1 and P2 in which P1 is generated with receiving the high going edge of the pulse signal and P2 is generated with receiving the low going edge of the pulse signal. By combing the internal pulse signals P1 and P2, a clock signal having the same frequency with the pulse signal is output in section A, while a dual edge clock signal having a frequency faster two times than the frequency of the pulse signal is output in section B where the level of the selection signal is high.

Figure 3:
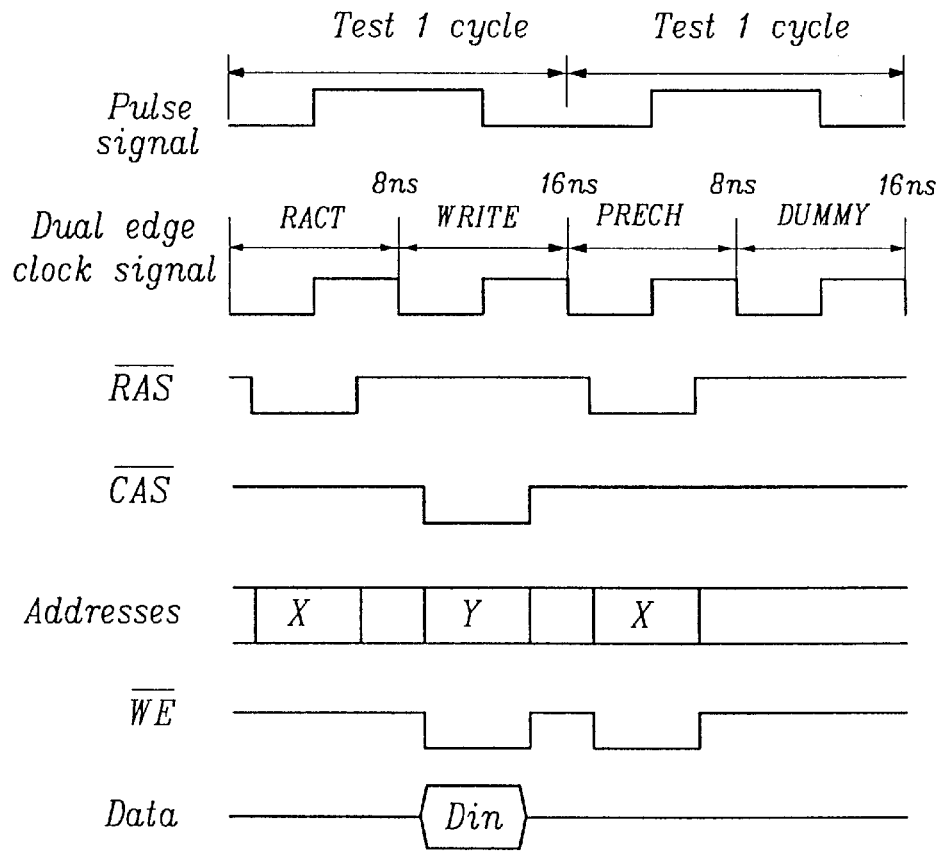
FIG. 3 is timing diagram of synchronous DRAM operated with receiving the clock signal from the dual clock signal generator of the present invention.

FIG. 3 is timing diagram of a synchronous memory device operating when receiving the dual edge clock signal. The pulse signal has a cycle time of, e.g., 16 ns when the minimum rate of the test equipment is 16 ns, and the test 1 cycle corresponds to one cycle of the pulse signal. However, the synchronous device uses the dual edge clock signal as the system clock of the present invention, and hence the operation of the synchronous device is accomplished with a cycle time of 8 ns.

The dual edge clock signal is used as the reference for all synchronous DRAM operations. All operations of the synchronous device are synchronized to the positive going edge of the clock. During the operation with the clock high, all inputs are assumed to be in valid state for the duration of setup and hold time around the positive edge of the clock for proper functionality and current specification.

The section RACT in FIG. 3, represents row active section where RAS/ goes down and CAS/ sustains its inactive high state. An address signal entering in this section is recognized as row address (X address). WE remains at an inactive high level in this section. It is general in the synchronous DRAM that the operation modes are determined based on the states of RAS, CAS, and WE at the time the clock signal goes from low to high.

In the WRITE section, the synchronous device writes input data supplied from an external device into its selected storage location. At the time when the dual edge clock signal goes to high, RAS is high, CAS is low, and WE is low. Address signal entering in this section is recognized as column address (Y address), and the storage location is selected from this Y address and the X address designated in the previous RACT section.

In the PRECH section, a precharge operation is performed on an active bank which is a memory block selected by the addresses entering at the high going edge of the dual edge clock signal by asserting low on RAS and WE with maintaining CAS to be high.

In the DUMMY section where all of RAS, CAS, and WE remain inactive high level, the synchronous DRAM performs no operation, but this is needed to complete operations which require more than single clock cycle like bank activation, burst read, auto refresh, and the like.

As shown in FIG. 3, the row active operation and the write operation is performed in the test 1 cycle, and it can be understood that the synchronous DRAM performs its normal operations even using a test equipment providing a pulse signal which do not follow the operational speed of the synchronous device.

Figure 4:
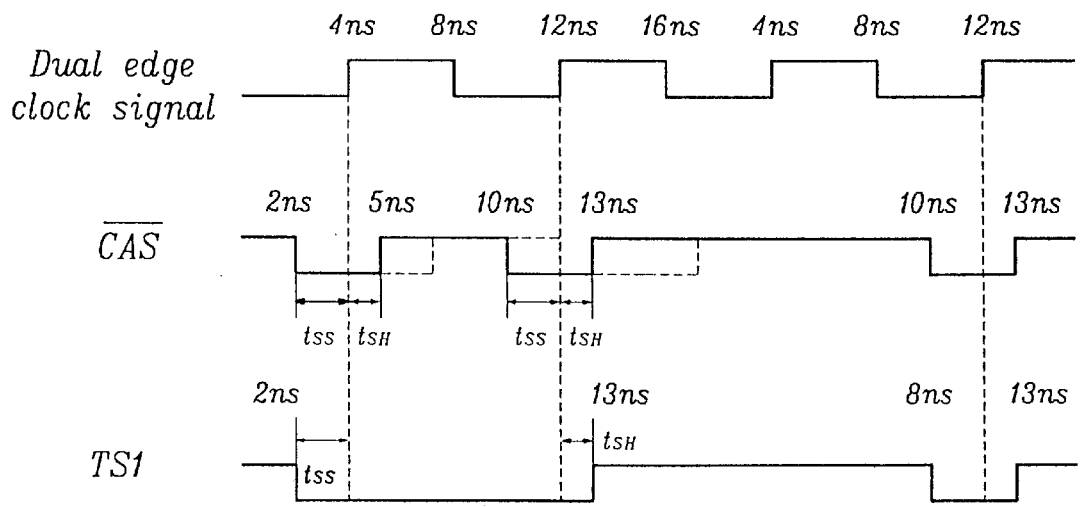
FIG. 4 is signal timing diagram showing the measurement of input setup time and input hold time.
Figure 5:
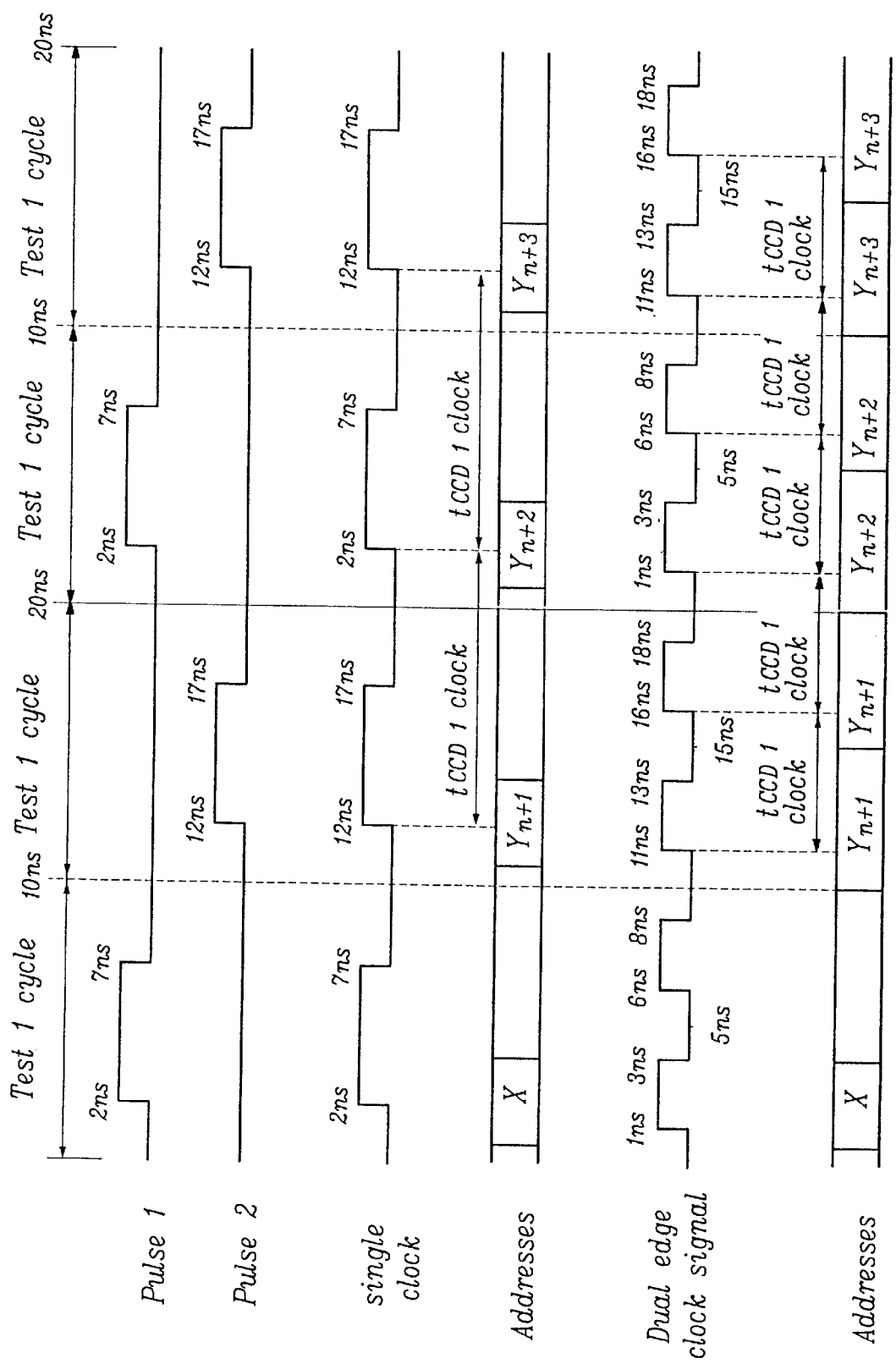
FIG. 5 is timing diagram for illustrating the limitation of address signal generation of the present invention when a test equipment having a pin multiplexing function is used.

Next, for overcoming the second inadequacy (as briefly mentioned above) related to the minimum clock cycle of the test equipment, we provide a test timing operation as shown in FIG. 4.

Referring to FIG. 4, the input setup time $t_{SH}$ is measured in the first clock cycle time and the input hold time tsh is measured in the second clock cycle time as shown in test timing TS1. The synchronous memory device will operate with one cycle of the dual edge clock signal, i.e., with cycle time of 8 ns. The dual edge clock signal is supplied from the dual clock generating circuit and the test equipment as explained before. Accordingly, the test cycle time becomes 16 ns. At this time, suppose that an operating mode has a CAS timing as shown in FIG. 4. CAS is toggling so as to be in active state in the first, the second, and the fourth operating cycles. And, the test equipment has the minimum clock cycle of 5 ns, and synchronous device requires the minimum input setup time $t_{SS}$ of 2 ns and the minimum input hold time $t_{SH}$ of 1 ns. The input setup time $t_{SS}$ can be specified as CAS must maintain its active low state '0' for 2 ns before the dual edge clock signal changed from '0' to '1', and the input hold time $t_{SH}$ can be specified as CAS must maintain its active low state '0' for 1 ns after the dual edge clock signal changed from '0' to '1'. If these times are not met, the synchronous DRAM can not recognize the active state of CAS.

The timing of CAS can be provided with satisfying the above presented minimum conditions by making CAS to fall '0' at 2 ns in the first operating cycle and to maintain the '0' level for 1 ns at 4 ns when the dual edge clock signal goes high '1', and then to go high '1' at 5 ns, as shown in FIG. 4. If this timing of CAS does not violate the minimum clock cycle of a test equipment, the input setup time $t_{SS}$ and the input hold time $t_{SH}$ can be measured every operating cycle of the synchronous device.

However, since the minimum clock cycle of the test equipment in this example is limited to be 5 ns, the test equipment can not supply CAS signal having cycle timing of 4 ns as shown in FIG. 4. That is to say, if the CAS goes down '0' at 2 ns in the first operating cycle, CAS must maintain its active value of '0' at least for 5 ns defined by the minimum clock cycle and thus CAS cannot go to '1' before 7 ns. Moreover, the minimum cycle time limitation is also applied to the '1' level of CAS, and thus CAS go can go to '0' at 12 ns in the second operating cycle. Accordingly, in the second operating cycle, the synchronous DRAM can not recognize the active state of CAS and expected operation can not be performed.

With the present invention, the timing signal TS1 does not toggle and, therefore, continuously remains its active state of '0' level in the first and the second operating cycles. The timing signal TS1 falls to '0' at 2 ns in the first operating cycle, and goes up to '1' at 13 ns in the second operating cycle. When this timing signal TS1 is provided to the memory device as a CAS signal, though the input setup time and the input hold time are not measured in every cycle of the IC device, it is possible to overcome the limitation related to the minimum clock cycle of the test equipment. That is, the setup time and input hold time might be measured every two, three or four IC cycles, but is not simultaneously. But since one or more cycles of the test equipment is divided into more cycles to match that of the IC device being tested, the input set time and the input hold time may not be measured each IC cycle. The input setup time $t_{SS}$ is measured at 4 ns, and the input hold time $t_{SH}$ is measured at 12 ns. Because the timing signal TS1 remains in its active state of '0' at both 4 ns and 12 ns when the dual edge clock signal is changed to '1', and the minimum input setup time and the minimum input hold time are met, the synchronous DRAM can recognize the TS1 as normal CAS signal. In the fourth operating cycle, CAS and TS1 have the same timings and meet the minimum input setup time the minimum input hold time.

In general, the duration time of the input signals must exceed the sum of the minimum input setup time and the minimum input hold time to operate the synchronous DRAM. Most CMOS registers have characteristic setup and hold times.

When a test equipment adopting so called a pin multiplexing scheme is used in the present invention, there is another limitation that only one address signal either X address or Y address is produced in test one cycle. Accordingly, it is difficult to check $t_{CCD}$ (column address to column address delay time) 1 clock and $t_{RDL}$ (last data-in to row precharge time) 1 clock characteristics.

For example, with the pin multiplexing scheme, a single clock having a cycle of 10 ns can be made from a pulse 1 and a pulse 2 both having a cycle of 20 ns and being generated in a test equipment. When the synchronous DRAM operates with reference to this single clock (i.e., when the present invention is not employed), the address signals entering at 2 ns and 12 ns when the single clock is changed to '1' are considered as valid addresses and storage locations are addressed by X and $Y_{n+1}$ addresses. Accordingly, it is possible to write or read data in or from the selected memory cell in every $t_{CCD}$ 1 clock (=10 ns).

On the other hand, when the dual edge clock technique of the present invention is used, the operating cycle of the synchronous DRAM is reduced to be 5 ns and the address signals considered as valid addresses entering at 1 ns, 6 ns, 11 ns, and 16 ns at which the dual edge clock signal goes to '1'. However, since the test equipment can produce one address signal in test one cycle of 10 ns, two addresses recognized as valid addresses in test one cycle are the same and thus one memory location is addressed twice. As a result, it is not possible to realize perfect $t_{CCD}$ one clock because the addresses are changed $Y_{n+1}$ $Y_{n+1}$ $Y_{n+2}$ $Y_{n+2}$ $Y_{n+3}$ $Y_{n+3}$ every $t_{CCD}$ one clock (=5 ns).

From this fact, some test patterns are repeated in the read and the write operations when new test patterns are provided by using the dual edge clock technique of the present invention.

As explained so far, with the present invention, the high speed IC device can be tested by using a test equipment having lower speed than the IC device, which allows the cost of investment to be reduced and the practical application of existing low speed test equipment to be widened.

While this invention has been described with reference to illustrative embodiments, this description is not intended to be construed in a limiting sense. Various modifications and combinations of the illustrative embodiments, as well as other embodiments of this invention, will be apparent to persons skilled in the art upon reference to the description. It is therefore intended that the appended claims encompass any such modifications or embodiments.

What is claimed is:

1. A test method for use on test equipment generating a test cycle, a pulse signal and control signals, said test method for testing semiconductor integrated circuit devices having a higher operating speeds than a minimum rate and a minimum clock cycle of said test equipment, said test method comprising the steps of:

determining the operating cycle of an integrated circuit device, said operating cycle being based on a cycle time of said integrated circuit devices' clock signal;

converting said pulse signal generated by said test equipment into a test equipment clock signal having a higher frequency than said minimum rate so that said test equipment clock signal is substantially equivalent to said integrated circuit device's clock signal and so that said test cycle of said test equipment is based on said cycle time of said integrated circuit devices' clock signal; and supplying an input setup time and an input hold time said control signals supplied from said test equipment to the integrated circuits devices so that the input setup time and input hold time are separately measured for every two or more operating cycles of the integrated circuit devices.

2. A test method as recited in claim 1, further comprising the step of:

generating said test equipment's clock signal as a dual edge clock signal by receiving both a high going edge and a low going edge of said pulse signal.

3. A test method as recited in claim 2 wherein said dual edge clock signal is generated by a clock signal generator, said method further comprising the steps of:

a first pulse generator producing a first pulse signal by receiving said high going edges of the pulse signal;

a second pulse generator producing a second pulse signal by receiving said low going edges of said pulse signal; and an OR gate summing said first and said second pulse signal.

4. A test method as recited in claim 3, wherein said clock signal generator further comprises a selection signal input terminal, said method further comprising the steps of:

activating said first and second pulse generators when a selection signal is active.

5. A test method as recited in claim 2, further comprising the step of:

testing synchronous DRAM integrated circuit devices wherein said dual edge clock signal is a system clock of a synchronous DRAM integrated circuit device.

6. A test method as recited in claim 2, further comprising the step of:

testing synchronous DRAM integrated circuit devices wherein said dual edge clock signal is an internal clock of a synchronous DRAM integrated circuit device.

7. A test method as recited in claim 1, further comprising the step of:

maintaining the sum of a minimum input setup time and minimum input hold time of said control signals so said minimum input setup time and said minimum input hold time are shorter than a minimum clock cycle of the test equipment.

8. A test method as recited in claim 1, further comprising the step of:

measuring the input setup time by a duration time of one of said control signals which maintains a constant level before the dual edge clock signal is changed to '1'.

9. A test method as recited in claim 1, further comprising the step of:

measuring the input hold time by a duration time of one of said control signals which maintains a constant level before the dual edge clock signal is changed to '1'.

10. A device for use with test equipment which generates a test cycle, a pulse signal and control signals, said device for allowing said test equipment testing to test semiconductor integrated circuit devices having a higher operating speeds than a minimum rate and a minimum clock cycle of said test equipment, said device comprising:

means for determining the operating cycle of an integrated circuit device, said operating cycle being based on a cycle time of said integrated circuit devices' clock signal;

means for converting said pulse signal generated by said test equipment into a test equipment clock signal having a higher frequency than said minimum rate so that said test equipment clock signal is substantially equivalent to said integrated circuit device's clock signal and so that said test cycle of said test equipment is based on said cycle time of said integrated circuit devices' clock signal; and means for supplying an input setup time and an input hold time said control signals supplied from said test equipment to the integrated circuits devices so that the input setup time and input hold time are separately measured for every two or more operating cycles of the integrated circuit devices.

11. A device as recited in claim 1 wherein said test equipment's clock signal is a dual edge clock signal is generated by a clock signal generator, said method further comprising the steps of:

first pulse means for producing a first pulse signal by receiving said high going edges of the pulse signal;

second pulse means for generator producing a second pulse signal by receiving said low going edges of said pulse signal; and an OR gate summing said first and said second pulse signal.

12. A device as recited in claim 11 wherein said first pulse means is a first pulse generator and said second pulse means is a second pulse generator.

13. A device for use with test equipment which generates a test cycle, a pulse signal and control signals, said device for allowing said test equipment testing to test semiconductor integrated circuit devices having a higher operating speeds than a minimum rate and a minimum clock cycle of said test equipment, said device comprising:

an input device which determines the operating cycle of an integrated circuit device, said operating cycle being based on a cycle time of said integrated circuit devices' clock signal;

a converter which converts said pulse signal generated by said test equipment into a test equipment clock signal having a higher frequency than said minimum rate so that said test equipment clock signal is substantially equivalent to said integrated circuit device's clock signal and so that said test cycle of said test equipment is based on said cycle time of said integrated circuit devices' clock signal; and an output device for supplying an input setup time and an input hold time said control signals supplied from said test equipment to the integrated circuits devices so that the input setup time and input hold time are separately measured for every two or more operating cycles of the integrated circuit devices.

14. A device as recited in claim 1 wherein said test equipment's clock signal is a dual edge clock signal is generated by a clock signal generator, said method further comprising the steps of: a first pulse generator which generates a first pulse signal by receiving said high going edges of the pulse signal;

a second pulse generator which generates a second pulse signal by receiving said low going edges of said pulse signal; and an OR gate summing said first and said second pulse signal.

15. A device as recited in claim 14, wherein the clock signal generator further comprises a selection signal input terminal, and the first and the second pulse generators are active when the selection signal is active.

16. A device as recited in claim 14, wherein the integrated circuit devices are synchronous DRAMs, and the dual edge clock signal is a system clock of the synchronous DRAMs.

17. A device as recited in claim 14, wherein the integrated circuit devices are synchronous DRAMs, and the dual edge clock signal is an internal clock of the synchronous DRAMs.

18. A device as recited in claim 13, wherein the sum of a minimum input setup time and a minimum input hold time of the plurality of control signals is shorter than the minimum clock cycle of the test equipment.

19. A device as recited in claim 18, wherein the input setup time is measured by a duration time of the control signal maintaining a constant level before the dual edge clock signal is changed to '1'.

20. A device as recited in claim 18, wherein the input hold time is measured by a duration time of the control signal maintaining a constant level after the dual edge clock signal is changed to '1'.

* * * * *